US012387907B2

(12) United States Patent
Koshimizu

(10) Patent No.: US 12,387,907 B2
(45) Date of Patent: Aug. 12, 2025

(54) PLASMA PROCESSING APPARATUS AND SUBSTRATE PROCESSING METHOD

(71) Applicant: Tokyo Electron Limited, Tokyo (JP)

(72) Inventor: Chishio Koshimizu, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 128 days.

(21) Appl. No.: 18/380,239

(22) Filed: Oct. 16, 2023

(65) Prior Publication Data
US 2024/0062991 A1 Feb. 22, 2024

Related U.S. Application Data

(63) Continuation of application No. PCT/JP2022/016485, filed on Mar. 31, 2022.

(30) Foreign Application Priority Data

Apr. 23, 2021 (JP) .................................. 2021-073411

(51) Int. Cl.
*H01J 37/32* (2006.01)

(52) U.S. Cl.
CPC .. *H01J 37/32146* (2013.01); *H01J 37/32422* (2013.01); *H01J 37/3244* (2013.01); *H01J 37/32715* (2013.01); *H01J 2237/327* (2013.01)

(58) Field of Classification Search
CPC .......... H01J 37/32146; H01J 37/32422; H01J 37/3244; H01J 37/32715; H01J 2237/327
See application file for complete search history.

(56) References Cited

U.S. PATENT DOCUMENTS

| 2022/0122810 A1* | 4/2022 | Kubota | ............. | H01J 37/32091 |
| 2022/0384150 A1* | 12/2022 | Koshimizu | ....... | H01J 37/32183 |
| 2023/0162946 A1* | 5/2023 | Koshimizu | ....... | H01J 37/32706 |
| | | | | 315/111.21 |

(Continued)

FOREIGN PATENT DOCUMENTS

| CN | 102067279 A | * | 5/2011 | ............... B08B 5/00 |
| JP | 2019-169635 A | | 10/2019 | |

(Continued)

OTHER PUBLICATIONS

International Search Report and Written Opinion mailed on Jun. 7, 2022, received for PCT Application PCT/JP2022/016485, filed on Mar. 31, 2022, 10 pages including English Translation.

*Primary Examiner* — Adam D Houston
(74) *Attorney, Agent, or Firm* — XSENSUS LLP

(57) ABSTRACT

A plasma processing apparatus comprises a chamber, a substrate support, a plasma generator, a bias power supply and a chuck power supply. The substrate support includes a base and a dielectric part. The base includes a base member and an electrode. The base member is made of a dielectric or an insulator. The electrode is formed on an upper surface of the base member. The electrode forms an upper surface of the base. The dielectric part provides a supporting surface on which a substrate is placed. The dielectric part extends from the upper surface of the base to the supporting surface and is made of only a dielectric. The bias power supply and the chuck power supply are electrically connected to the electrode of the base.

13 Claims, 12 Drawing Sheets

(56) References Cited

U.S. PATENT DOCUMENTS

| | | | |
|---|---|---|---|
| 2023/0260766 A1* | 8/2023 | Torii | H01J 37/32642 |
| | | | 315/111.21 |
| 2024/0062991 A1* | 2/2024 | Koshimizu | H01J 37/32706 |
| 2025/0046573 A1* | 2/2025 | Bin Budiman | H01L 21/3065 |
| 2025/0069851 A1* | 2/2025 | Koshimizu | H01J 37/32715 |
| 2025/0096006 A1* | 3/2025 | Sasaki | H01L 21/31116 |

FOREIGN PATENT DOCUMENTS

| | | |
|---|---|---|
| JP | 2020-115541 A | 7/2020 |
| JP | 2020-534668 A | 11/2020 |
| JP | 2020-205444 A | 12/2020 |
| WO | 2019/060028 A1 | 3/2019 |
| WO | 2020/159674 A1 | 8/2020 |
| WO | WO-2024162171 A1 * | 8/2024 |

\* cited by examiner

PLASMA PROCESSING APPARATUS AND SUBSTRATE PROCESSING METHOD

CROSS-REFERENCE TO RELATED APPLICATIONS

This application is a bypass continuation application of International Application No. PCT/JP2022/016485 having an international filing date of Mar. 31, 2022 and designating the United States, the International Application being based upon and claiming the benefit of priority from Japanese Patent Application No. 2021-073411, filed on Apr. 23, 2021, the entire contents of which are incorporated herein by reference.

TECHNICAL FIELD

Exemplary embodiments of the present disclosure relate to a plasma processing apparatus and a substrate processing method.

BACKGROUND

A plasma processing apparatus is used for plasma processing of a substrate. The plasma processing apparatus includes a chamber and a substrate support. The substrate support includes a base and an electrostatic chuck. The base constitutes a lower electrode. A bias power supply is connected to the base. The electrostatic chuck is disposed on the base. The electrostatic chuck includes an insulating layer and an electrode embedded in the insulating layer. A DC power supply is connected to the electrode of the electrostatic chuck. Japanese Laid-open Patent Publication No. 2019-169635 and Japanese Laid-open Patent Publication No. 2020-205444 disclose the above-described plasma processing apparatus.

SUMMARY

The present disclosure provides a technique for efficiently supplying bias energy from a bias power supply to a substrate.

In one exemplary embodiment of the present disclosure, a plasma processing apparatus is provided. The plasma processing apparatus comprises a chamber, a substrate support, a plasma generator, a bias power supply and a chuck power supply. The substrate support is disposed in the chamber. The plasma generator is configured to generate plasma in the chamber. The bias power supply is configured to generate bias energy for attracting ions from the plasma to a substrate. The chuck power supply is configured to generate a voltage applied to the substrate support to hold the substrate using an electrostatic attractive force. The bias energy is a radio frequency power or a periodically generated voltage pulse. The substrate support includes a base and a dielectric part. The base includes a base member and an electrode. The base member is made of a dielectric or an insulator. The electrode is formed on an upper surface of the base member. The electrode forms an upper surface of the base. The dielectric part provides a supporting surface on which the substrate is placed. The dielectric part extends from the upper surface of the base to the supporting surface and is made of only a dielectric. The bias power supply and the chuck power supply are electrically connected to the electrode of the base.

DETAILED DESCRIPTION

Figure 1:
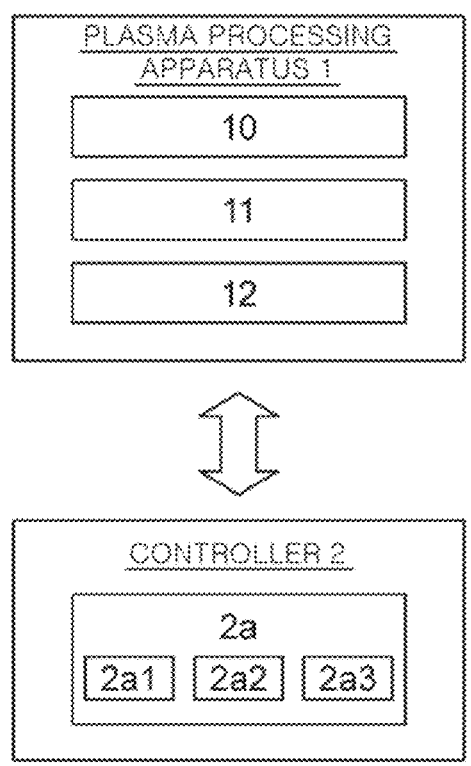
FIG. 1 schematically shows a plasma processing apparatus according to one exemplary embodiment.

Hereinafter, various exemplary embodiments will be described.

In one exemplary embodiment of the present disclosure, a plasma processing apparatus is provided. The plasma processing apparatus comprises a chamber, a substrate support, a plasma generator, a bias power supply and a chuck power supply. The substrate support is disposed in the chamber. The plasma generator is configured to generate plasma in the chamber. The bias power supply is configured to generate bias energy for attracting ions from the plasma to a substrate. The chuck power supply is configured to generate a voltage applied to the substrate support to hold the substrate using an electrostatic attractive force. The bias energy is a radio frequency power or a periodically generated voltage pulse. The substrate support includes a base and a dielectric part. The base includes a base member and an electrode. The base member is made of a dielectric or an insulator. The electrode is formed on an upper surface of the base member. The electrode forms an upper surface of the base. The dielectric part provides a supporting surface on which the substrate is placed. The dielectric part extends from the upper surface of the base to the supporting surface and is made of only a dielectric. The bias power supply and the chuck power supply are electrically connected to the electrode of the base.

In the above embodiment, the electrode is not disposed in the dielectric part, so that the thickness of the dielectric part can be reduced. Therefore, the impedance between the electrode of the base and the substrate is reduced. Accordingly, the bias energy is efficiently supplied to the substrate.

In one exemplary embodiment of the present disclosure, the bias power supply may be electrically connected to the electrode via a capacitor. The bias power is separated from the chuck power supply in a DC manner.

In one exemplary embodiment of the present disclosure, the bias power supply and the chuck power supply may be electrically connected to the electrode via a wiring extending between the upper surface and a bottom surface of the base member.

In one exemplary embodiment of the present disclosure, the plasma generator may include a radio frequency power supply electrically connected to the electrode of the base.

In one exemplary embodiment of the present disclosure, the supporting surface may include a first region on which the substrate is placed and a second region on which an edge ring is placed. In this embodiment, the electrode is a first electrode disposed below the first region. The base may further include a second electrode. The second electrode is disposed below the second region, forms the upper surface of the base, and is separated from the first electrode. The bias power supply or another bias power supply and another chuck power supply are electrically connected to the second electrode.

In one exemplary embodiment of the present disclosure, the second electrode may include two electrodes constituting a bipolar electrode. Said another chuck power supply may include two power supplies respectively connected to the two electrodes.

In one exemplary embodiment of the present disclosure, the bias power supply or said another bias power supply may be electrically connected to the second electrode via a capacitor. The bias power supply or said another bias power supply is separated from said another chuck power supply in a DC manner.

In one exemplary embodiment of the present disclosure, the bias power supply or said another bias power supply and said another chuck power supply may be electrically connected to the second electrode via a wiring extending between the upper surface and a bottom surface of the base member.

In one exemplary embodiment of the present disclosure, a plasma processing apparatus is provided. The plasma processing apparatus includes a chamber, a substrate support, a plasma generator, a bias power supply and a chuck power supply. The substrate support is disposed in the chamber. The plasma generator is configured to generate plasma in the chamber. The bias power supply is configured to generate bias energy for attracting ions from the plasma to a substrate. The chuck power supply is configured to generate a voltage applied to the substrate support to hold the substrate using an electrostatic attractive force. The bias energy is a radio frequency power or a periodically generated voltage pulse. The substrate support includes a base and a dielectric part. The dielectric part provides a supporting surface on which a substrate is placed, extends from an upper surface of the base to the supporting surface, and is made of only a dielectric. The supporting surface includes a first region on which the substrate is placed and a second region on which an edge ring is placed. The base includes a first portion and a second portion. The first portion is made of a conductive material and disposed below the first region. The second portion is made of a conductive material, disposed below the second region, and separated from the first portion. The bias power supply and the chuck power supply are electrically connected to the first portion. The bias power supply or another bias power supply and another chuck power supply are electrically connected to the second portion.

In the above embodiment, the electrode is not disposed in the dielectric part, so that the thickness of the dielectric part can be reduced. Therefore, the impedance between the first portion of the base and the substrate and the impedance between the second portion of the base and the edge ring are reduced. Accordingly, the bias energy is efficiently delivered to the substrate and the edge ring.

In one exemplary embodiment of the present disclosure, the second portion may include two portions constituting a bipolar electrode. Said another chuck power supply may include two power supplies respectively connected to the two portions.

In one exemplary embodiment of the present disclosure, the bias power supply may be electrically connected to the first portion via a capacitor. The bias power supply is separated from the chuck power supply in a DC manner. The bias power supply or said another bias power supply may be electrically connected to the second portion via a capacitor. The bias power supply or said another bias power supply is separated from the separate chuck power supply in a DC manner.

In one exemplary embodiment of the present disclosure, the plasma generator may include a radio frequency power supply electrically connected to the first portion of the base.

In another exemplary embodiment of the present disclosure, a substrate processing method using the plasma processing apparatus according to one of the exemplary embodiments is provided. The substrate processing method comprises placing a substrate on the dielectric part of the substrate support. The substrate processing method comprises generating plasma in the chamber using the plasma generator. The substrate processing method comprises holding the substrate on the substrate support by supplying a voltage from the chuck power supply. The substrate processing method comprises attracting ions from the plasma to the substrate by supplying the bias energy from the bias power supply.

Hereinafter, various exemplary embodiments will be described in detail with reference to the accompanying drawings. Further, like reference numerals will be used for like or corresponding parts throughout the drawings.

Figure 2:
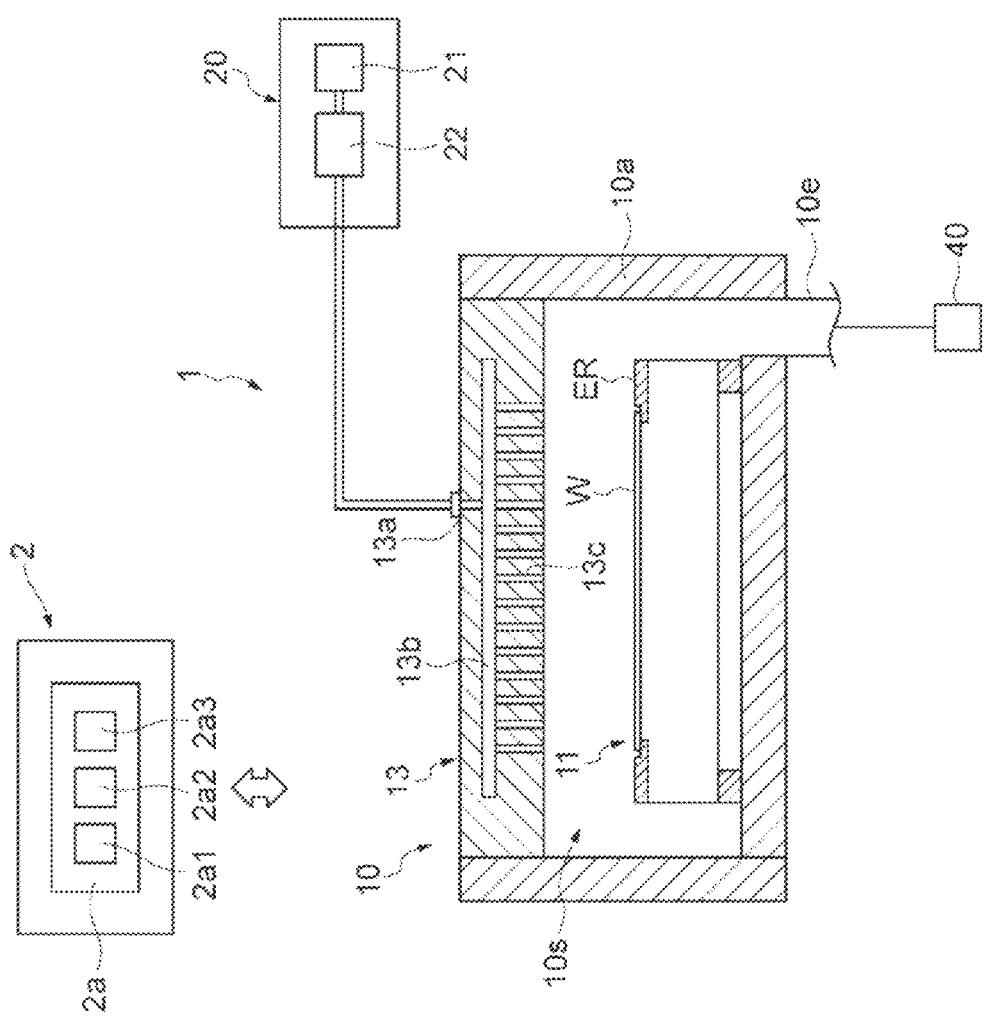
FIG. 2 schematically shows a plasma processing apparatus according to one exemplary embodiment.

FIGS. 1 and 2 schematically show a plasma processing apparatus according to one exemplary embodiment.

In one embodiment, a plasma processing system includes a plasma processing apparatus 1 and a controller 2. The plasma processing apparatus 1 includes a plasma processing chamber 10, a substrate support 11, and a plasma generator 12. The plasma processing chamber 10 has a plasma processing space. Further, the plasma processing chamber 10 includes at least one gas inlet for supplying at least one processing gas to the plasma processing space, and at least one gas outlet for exhausting a gas from the plasma processing space. The gas inlet is connected to a gas supply part 20 to be described later, and the gas outlet is connected to an exhaust system 40 to be described later. The substrate support 11 is disposed in the plasma processing space, and has a substrate supporting surface for supporting the substrate.

The plasma generator 12 is configured to generate plasma from at least one processing gas supplied into the plasma processing space. The plasma generated in the plasma processing space includes capacitively coupled plasma (CCP), inductively coupled plasma (ICP), electron-cyclotron-resonance (ECR) plasma, and helicon wave excited (HWP) plasma, surface wave plasma (SWP), or the like. Further, various types of plasma generators including an alternating current (AC) plasma generator and a direct current (DC) plasma generator may be used. In one embodiment, an AC signal (AC power) used in the AC plasma generator has a frequency within a range of 100 kHz to 10 GHz. Therefore, the AC signal includes a radio frequency (RF) signal and a microwave signal. In one embodiment, the RF signal has a frequency within a range of 200 kHz to 150 MHz.

The controller 2 processes computer-executable instructions that cause the plasma processing apparatus 1 to perform various steps described in the present disclosure. The controller 2 may be configured to control individual components of the plasma processing apparatus 1 to perform various steps described herein. In one embodiment, the controller 2 may be partially or entirely included in the plasma processing apparatus 1. The controller 2 may include, for example, a computer 2a. The computer 2a may include, for example, a central processing unit (CPU) 2a1, a storage device 2a2, and a communication interface 2a3. The central processing unit 2a1 may be configured to perform various control operations based on programs stored in the storage device 2a2. The storage device 2a2 may include a random access memory (RAM), a read only memory (ROM), a hard disk drive (HDD), a solid state drive (SSD), or a combination thereof. The communication interface 2a3 may communicate with the plasma processing apparatus 1 through a communication line such as a local area network (LAN).

Hereinafter, a configuration example of a capacitively coupled plasma processing apparatus as an example of the plasma processing apparatus 1 will be described. The capacitively coupled plasma processing apparatus 1 includes a plasma processing chamber 10, a gas supply part 20, a plurality of power supplies, and an exhaust system 40. The plasma processing apparatus 1 further includes a substrate support 11 and a gas introducing part. The gas introducing part is configured to introduce at least one processing gas into the plasma processing chamber 10. The gas introducing part includes a shower head 13. The substrate support 11 is disposed in the plasma processing chamber 10. The shower head 13 is disposed above the substrate support 11. In one embodiment, the shower head 13 forms at least a part of the ceiling of the plasma processing chamber 10. The plasma processing chamber 10 has a plasma processing space 10s defined by the shower head 13, a sidewall 10a of the plasma processing chamber 10, and the substrate support 11. The sidewall 10a is grounded. The shower head 13 and the substrate support 11 are electrically insulated from the housing of the plasma processing chamber 10.

The substrate support 11 is configured to support the substrate W placed thereon. The substrate support 11 is configured to further support an edge ring ER placed thereon. The edge ring ER is an annular member, and is made of a material such as silicon or silicon carbide. The substrate W is placed on the substrate support 11 and is disposed in the region surrounded by the edge ring ER. The substrate support 11 may include a temperature control module configured to adjust at least one of the edge ring ER and the substrate W to a target temperature. The temperature control module may include a heater, heat transfer medium, a channel, or combinations thereof. A heat transfer fluid, such as brine or a gas, flows through the channel. Further, the substrate support 11 may include a heat transfer gas supply part configured to supply a heat transfer gas to a gap between the backside of the substrate W and a substrate supporting surface 111a.

The shower head 13 is configured to introduce at least one processing gas from the gas supply part 20 into the plasma processing space 10s. The shower head 13 has at least one gas supply port 13a, at least one gas diffusion space 13b, and a plurality of gas inlet ports 13c. The processing gas supplied to the gas supply port 13a passes through the gas diffusion space 13b and is introduced into the plasma processing space 10s from the gas inlet ports 13c. The shower head 13 also includes a conductive member. The conductive member of the shower head 13 functions as an upper electrode. The gas introducing part may include, in addition to the shower head 13, one or more side gas injectors (SGI) attached to one or more openings formed in the sidewall 10a.

The gas supply part 20 may include at least one gas source 21 and at least one flow rate controller 22. In one embodiment, the gas supply part 20 is configured to supply at least one processing gas from the corresponding gas source 21 to the shower head 13 through the corresponding flow rate controller 22. The flow rate controllers 22 may include, for example, a mass flow controller or a pressure-controlled flow rate controller. Further, the gas supply part 20 may include at least one flow modulation device for modulating the flow rate of at least one processing gas or causing it to pulsate.

The power supplies include one or more radio frequency power supplies constituting the plasma generator, one or more bias power supplies for generating bias energy for attracting ions to the substrate, and one or more chuck power supplies for maintaining the substrate W and the edge ring ER using an electrostatic attractive force. These power supplies will be described later.

The exhaust system 40 may be connected to a gas exhaust port 10e disposed at the bottom portion of the plasma processing chamber 10, for example. The exhaust system 40 may include a pressure control valve and a vacuum pump. The pressure in the plasma processing space 10s is adjusted by the pressure control valve. The vacuum pump may include a turbo molecular pump, a dry pump, or a combination thereof.

Figure 3:
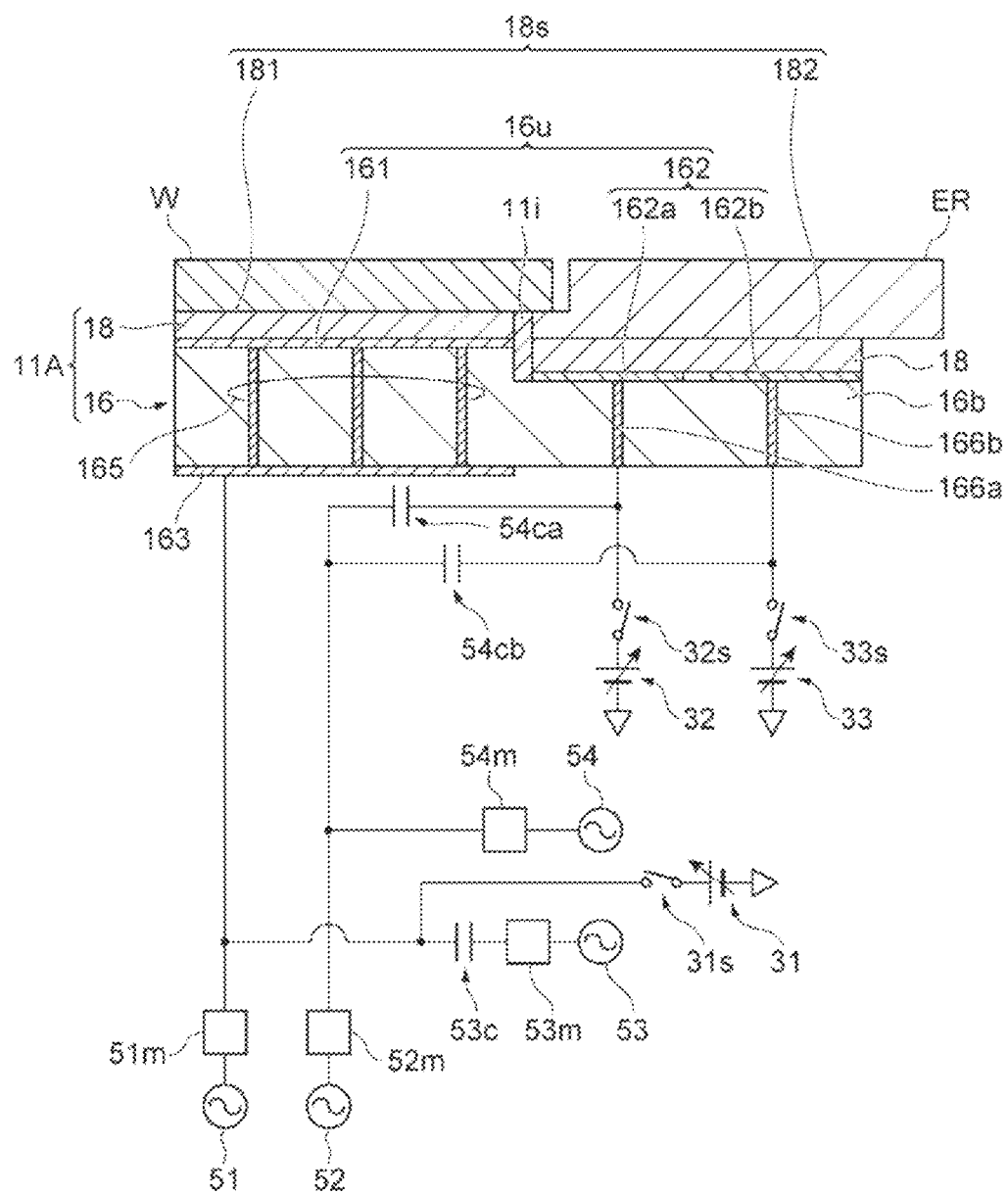
FIG. 3 shows a substrate support and a plurality of power supplies of a plasma processing apparatus according to one exemplary embodiment.

Hereinafter, FIG. 3 will be referred to. FIG. 3 shows a substrate support and a plurality of power supplies of a plasma processing apparatus according to one exemplary embodiment. The substrate support section 11A shown in FIG. 3 may be employed as the substrate support section 11 of the plasma processing apparatus 1.

A substrate support 11A includes a base 16 and a dielectric part 18. The base 16 includes a base member 16b and one or more electrodes. The base member 16b is made of a dielectric or an insulator. The base member 16b has a substantially disc shape. The base member 16b is made of ceramic, such as aluminum nitride or aluminum oxide.

One or more electrodes of the base 16 are formed on the upper surface of the base member 16b. One or more electrodes of the base 16 constitute an upper surface 16u of the base 16. One or more electrodes of base 16 may be conductive films. In one embodiment, the base 16 may include, as one or more electrodes, a first electrode 161 and a second electrode 162. The first electrode 161 includes the center of the upper surface 16u, and has a substantially circular shape. The second electrode 162 is separated from the first electrode 161. The second electrode 162 may extend in a circumferential direction to surround the first electrode 161. In other words, the second electrode 162 may have an annular shape.

In one embodiment, the second electrode 162 may include two electrodes 162a and 162b constituting a bipolar electrode. The two electrodes 162a and 162b are separated from each other. Each of the two electrodes 162a and 162b may have an annular shape. One of the two electrodes 162a and 162b may extend in the circumferentially direction at a radially outer side of the other electrode. Alternatively, each of the two electrodes 162a and 162b may include a plurality of electrodes that are separated from each other and arranged in the circumferential direction.

In one embodiment, the base 16 may include an electrode 163. The electrode 163 may be a conductive film formed on the bottom surface of the base member 16b. In one embodiment, the base 16 may include a plurality of wirings 165, 166a, and 166b. The wirings 165, 166a, and 166b extend between the upper surface and the bottom surface of the base member 16b. One or more wirings 165 connect the first electrode 161 and the electrode 163. One or more wirings 166a are connected to the electrode 162a. One or more wirings 166b are connected to the electrode 162b. Each of the wirings 165, 166a, and 166b may be a via hole formed in the base member 16b. Alternatively, each of the wirings 165, 166a, and 166b may be a conductor line formed along the surface of the base member 16b. The electrode 163 may be a planar electrode, or may be a wiring that connects the power supply points for the first electrode 161, the electrode 162a, and the electrode 162b to the wiring 165, 166a, and 166b, respectively.

The dielectric part 18 provides a supporting surface 18s on which the substrate W is placed. The dielectric part 18 extends from the upper surface 16u of the base 16 to the supporting surface 18s, and is made of only a dielectric. The dielectric part 18 is made of ceramic such as aluminum nitride or aluminum oxide.

In one embodiment, the supporting surface 18s of the dielectric part 18 may include a first region 181 and a second region 182. The first region 181 includes the center of the supporting surface 18s, and has a substantially circular shape. The substrate W is placed on the first region 181. The first region 181 extends above the first electrode 161 of the base 16. In other words, the first electrode 161 is disposed below the first region 181.

The second region 182 extends in the circumferential direction at a radially outer side of the first region 181. In other words, the second region 182 has an annular shape. The edge ring ER is placed on the second region 182. The second region 182 extends above the second electrode 162 of the base 16. In other words, the second electrode 162 (the electrodes 162a and 162b) is disposed below the second region 182.

In one embodiment, the substrate support 11 may further include an insulator part 11i. The insulator part 11i covers the end surface (the outer circumferential surface) of the first electrode 161 and the inner end surface (the inner circumferential surface) of the second electrode 162 to hide them from plasma. In one embodiment, the dielectric part 18 may be separated into a portion providing the first region 181 and a portion providing the second region 182. The insulator part 11i may be interposed between the outer circumferential surface of the portion providing the first region 181 and the inner circumferential surface of the portion providing the second region 182.

The power supplies of the plasma processing apparatus 1 may include chuck power supplies 31, 32, and 33. Each of the chuck power supplies 31, 32, and 33 is a DC power supply or a variable DC power supply. The chuck power supply 31 is connected to the first electrode 161 via a switch 31s, an electrode 163, and one or more wirings 165. When a DC voltage from the chuck power supply 31 is applied to the first electrode 161, the substrate W is attracted to the first region 181 by the electrostatic attractive force and is held on the substrate support 11A.

The chuck power supply 32 is connected to the electrode 162a via a switch 32s and one or more wirings 166a. The chuck power supply 33 is connected to the electrode 162b via a switch 33s and one or more wirings 166b. When a DC voltage from the chuck power supply 32 is applied to the electrode 162a and a DC voltage from the chuck power supply 33 is applied to the electrode 162b, the edge ring ER is attracted to the second region 182 by the electrostatic attractive force and is held on the substrate support 11A.

The power supplies of the plasma processing apparatus 1 include one or more radio frequency power supplies and one or more bias power supplies. In the example shown in FIG. 3, the power supplies include a radio frequency power supply 51, a radio frequency power supply 52, a bias power supply 53, and a bias power supply 54.

The radio frequency power supply 51 and the radio frequency power supply 52 constitute a plasma generator of one embodiment. Each of the radio frequency power supply 51 and the radio frequency power supply 52 generates a radio frequency power having a frequency suitable for generating plasma from a gas in the chamber 10. The radio frequency power generated by each of the radio frequency power supplies 51 and 52 has a frequency within a range of 13 MHz to 150 MHz, for example.

The radio frequency power supply 51 is connected to the first electrode 161 via a matching device 51m, an electrode 163, and one or more wirings 165. The matching device 51m includes a matching circuit for matching an impedance of a load of the radio frequency power supply 51 with an output impedance of the radio frequency power supply 51.

The radio frequency power supply 52 is connected to the electrode 162a via a matching device 52m, a capacitor 54ca, and one or more wirings 166a. Further, the radio frequency power supply 52 is connected to the electrode 162b via the matching device 52m, a capacitor 54cb, and one or more wirings 166b. The matching device 52m includes a matching circuit for matching the impedance of the load of the radio frequency power supply 52 with the output impedance of the radio frequency power supply 52. The capacitor 54ca separates the radio frequency power supply 52 from the chuck power supply 32 in a DC manner. The capacitor 54cb separates the radio frequency power supply 52 from the chuck power supply 33 in a DC manner.

The bias power supplies 53 and 54 generate bias energy for attracting ions to the substrate W and the edge ring ER. The bias energy may be a radio frequency bias power. The radio frequency bias power has a frequency within a range of 100 kHz to 13.56 MHz, for example. Alternatively, the bias energy may be periodically generated voltage pulses. The voltage pulse has positive polarity or negative polarity. The voltage pulse may have any waveform. The voltage pulse may be a negative DC voltage pulse. The voltage pulse is generated periodically with a repetition frequency within a range of 100 kHz to 13.56 MHz.

The bias power supply 53 is connected to the first electrode 161 via a matching device 53m, a capacitor 53c, an electrode 163, and one or more wirings 165. The matching device 53m includes a matching circuit for matching the impedance of the load of the bias power supply 53 with the output impedance of the bias power supply 53. The capacitor 53c is provided to separate the bias power supply 53 from the chuck power supply 31 in a DC manner.

The bias power supply 54 is connected to the electrode 162a via a matching device 54m, a capacitor 54ca, and one or more wirings 166a. Further, the bias power supply 54 is connected to the electrode 162b via a matching device 54m, a capacitor 54cb, and one or more wirings 166b. The matching device 54m includes a matching circuit for matching the impedance of the load of the bias power supply 54 with the output impedance of the bias power supply 54. The capacitor 54ca is provided to separate the bias power supply 54 from the chuck power supply 32 in a DC manner. The capacitor 54cb is provided to separate the bias power supply 54 from the chuck power supply 33 in a DC manner.

In the plasma processing apparatus 1, no electrode is disposed in the dielectric part 18, so that the thickness of the dielectric part 18 can be reduced. Therefore, the impedance between the first electrode 161 of the base 16 and the substrate W is reduced. Further, the impedance between each of the electrodes 162a and 162b of the base 16 and the edge ring ER is reduced. Accordingly, the bias energy is efficiently supplied to the substrate W. Further, the bias energy is efficiently supplied to the edge ring ER. Moreover, the radio frequency power is efficiently coupled to the plasma via the substrate W and the edge ring ER. Thus, it is possible to reduce the bias energy. Further, it is possible to reduce the radio frequency power. Hence, heat generation at the electrodes of the substrate support 11A, the contact points, and the like is suppressed.

Since the base member 16b of the base 16 is made of a dielectric or an insulator, the difference between the thermal expansion coefficient of the base 16 and the thermal expansion coefficient of the dielectric part 18 is small. Therefore, the damage to the substrate support 11A due to the difference between the thermal expansion coefficient of the base 16 and the thermal expansion coefficient of the dielectric part 18 is suppressed.

In one embodiment, the dielectric part 18 may satisfy the following Eq. (1).

$$0.5 \times C_{W0}/S_W < C_{FO}/S_F < 1.5 \times C_{W0}/S_W \qquad \text{Eq. (1)}$$

In Eq. (1), $C_{W0}$ indicates the capacitance between the base 16 and the substrate W. $S_W$ indicates the area of one main surface (for example, the bottom surface or the surface in contact with plasma) of the substrate W. $C_{FO}$ indicates the capacitance between the base 16 and the edge ring ER. Se indicates the area of one main surface (for example, the bottom surface or the surface in contact with plasma) of the edge ring. By satisfying Eq. (1), the difference between the power density of the radio frequency power coupled to the plasma via the substrate W and the power density of the radio frequency power coupled to the plasma via the edge ring ER is reduced. Therefore, the variation in the plasma density in the chamber is suppressed.

In one embodiment, the substrate support 11A may be configured such that the capacitance between the substrate W and the edge ring ER becomes 10 nF or less or 3 nF or less. Accordingly, the electrical coupling between the substrate W and the edge ring ER is suppressed.

Figure 4:
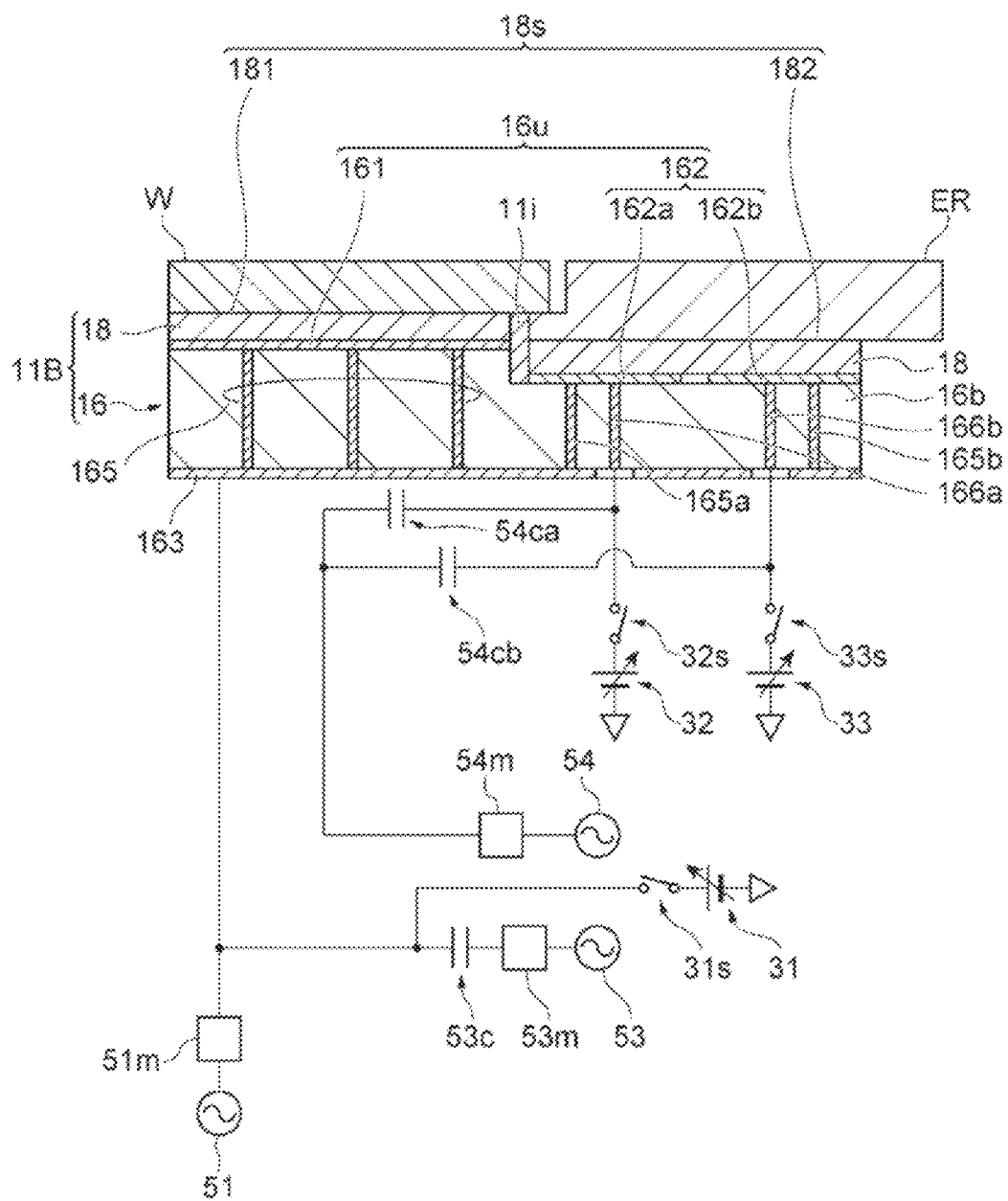
FIG. 4 shows a substrate support and a plurality of power supplies of a plasma processing apparatus according to another exemplary embodiment.

Hereinafter, FIG. 4 will be referred to. FIG. 4 shows a substrate support and a plurality of power supplies of a plasma processing apparatus according to another exemplary embodiment. A substrate support 11B shown in FIG. 4 may be employed as the substrate support 11 of the plasma processing apparatus 1. The substrate support 11B further includes one or more wirings 165a and one or more wirings 165b. One or more wirings 165a and one or more wirings 165b extend between the upper surface and the bottom surfaces of the base member 16b. One or more wirings 165a connect the electrode 163 and the electrode 162a. One or more wiring 165b connects the electrode 163 and the electrode 162b.

Each of one or more wirings 165a and one or more wirings 165b may be a via hole formed in the base member 16b. Alternatively, each of one or more wirings 165a and one or more wirings 165b may be a conductor line formed along the surface of the base member 16b.

In the example shown in FIG. 4, the plasma processing apparatus 1 does not include the radio frequency power supply 52 and the matching device 52m. In the example shown in FIG. 4, the radio frequency power supply 51 is connected to the electrode 162a via the matching device 51m, the electrode 163, and one or more wirings 165a. Further, the radio frequency power supply 51 is connected to the electrode 162b via the matching device 51m, the electrode 163, and one or more wirings 165b. In the example shown in FIG. 4, the radio frequency power from the single radio frequency power supply 51 is distributed to the first electrode 161 and the second electrode 162. The other configurations in the example shown in FIG. 4 are the same as those of the example shown in FIG. 3.

Figure 5:
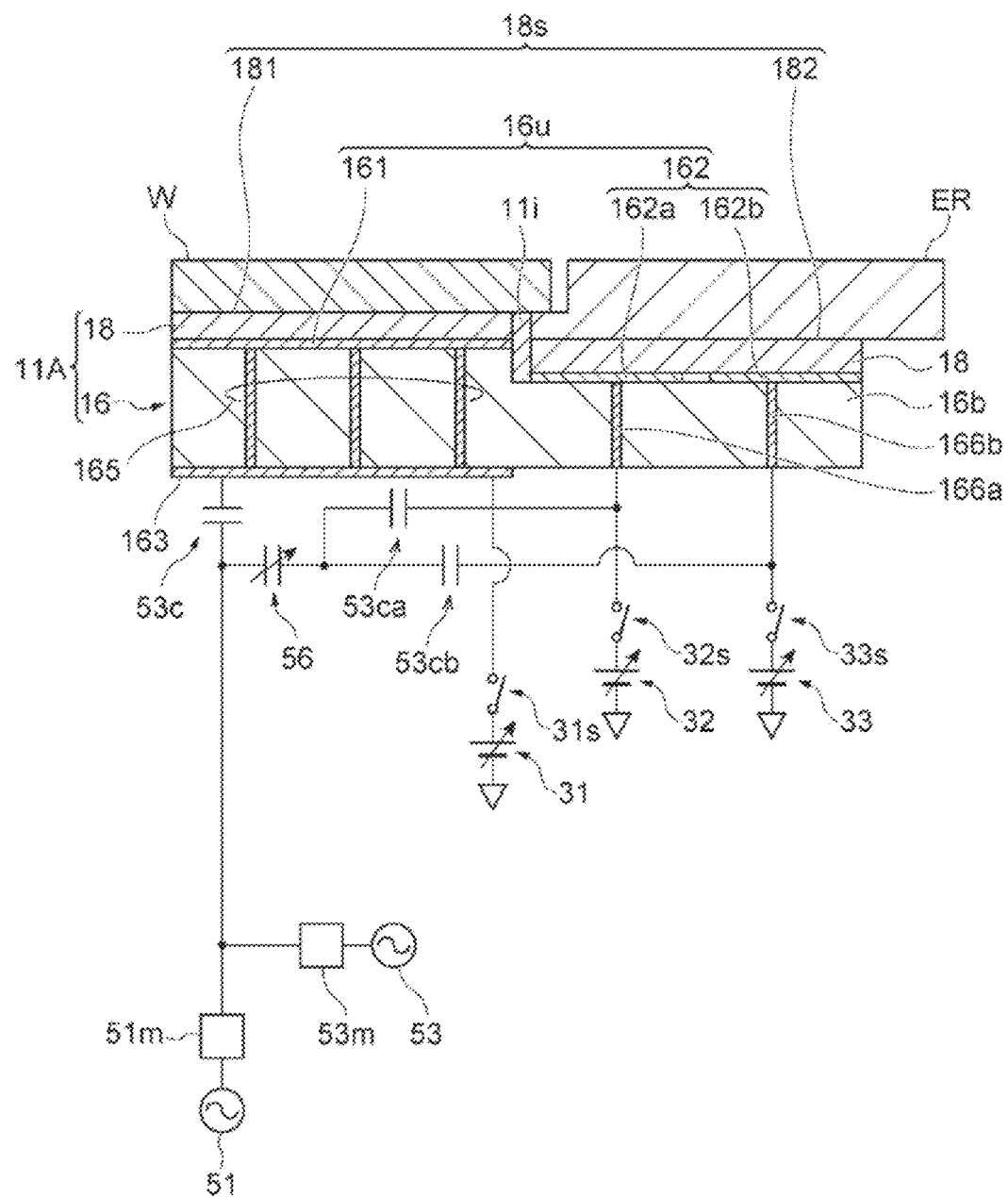
FIG. 5 shows a substrate support and a plurality of power supplies of a plasma processing apparatus according to still another exemplary embodiment.

Hereinafter, FIG. 5 will be referred to. FIG. 5 shows a substrate support and a plurality of power supplies of a plasma processing apparatus according to still another exemplary embodiment. As shown in FIG. 5, the plasma processing apparatus 1 may not include the radio frequency power supply 52, the matching device 52m, the bias power supply 54, and the matching device 54m.

As shown in FIG. 5, the radio frequency power supply 51 is connected to the electrode 162a via the matching device 51m, an impedance circuit 56, a capacitor 53ca, and the wiring 166a. Further, the radio frequency power supply 51 is connected to the electrode 162b via the matching device 51m, the impedance circuit 56, a capacitor 53cb, and the wiring 166b. The bias power supply 53 is connected to the electrode 162a via the matching device 53m, the impedance circuit 56, the capacitor 53ca, and the wiring 166a. Further, the bias power supply 53 is connected to the electrode 162b via the matching device 53m, the impedance circuit 56, the capacitor 53cb, and the wiring 166b. The capacitor 53ca is provided to separate the radio frequency power supply 51 and the bias power supply 53 from the chuck power supply 32 in a DC manner. The capacitor 53cb is provided to separate the radio frequency power supply 51 and the bias power supply 53 from the chuck power supply 33 in a DC manner.

The impedance circuit 56 has a variable impedance. The impedance circuit includes a variable impedance element, such as a variable capacitor. In the plasma processing apparatus 1 of the example shown in FIG. 5, the radio frequency power from the single radio frequency power supply 51 is distributed to the first electrode 161 and the second electrode 162. Further, in the plasma processing apparatus 1 of the example shown in FIG. 5, the bias energy from the single bias power supply 53 is distributed to the first electrode 161 and the second electrode 162. A distribution ratio of each of the radio frequency power and the bias energy is set by adjusting the variable impedance of the impedance circuit 56. The other configurations in the example shown in FIG. 5 are the same as those in the example shown in FIG. 3.

Figure 6:
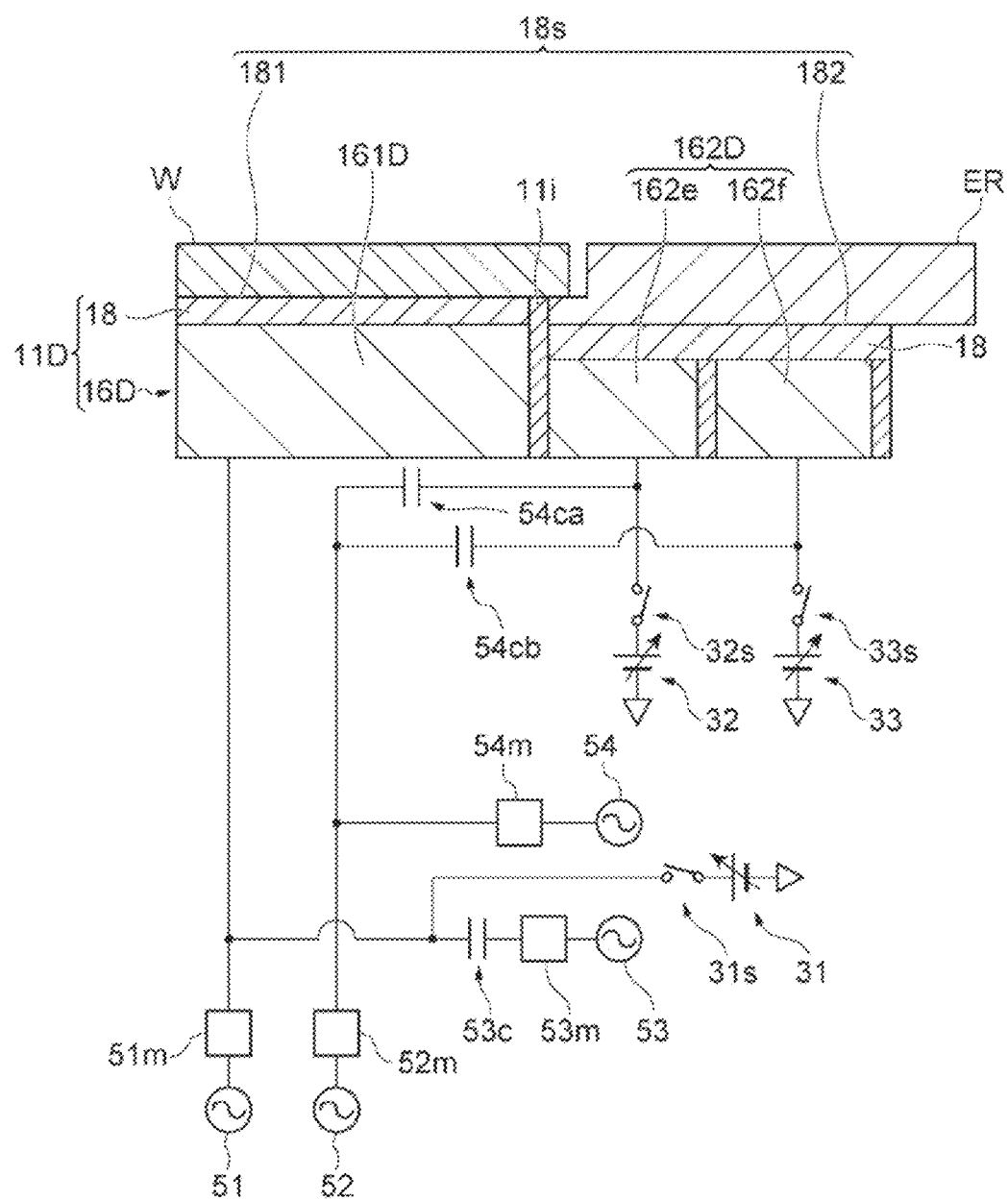
FIG. 6 shows a substrate support and a plurality of power supplies of a plasma processing apparatus according to further still another exemplary embodiment.

Hereinafter, FIG. 6 will be referred to. FIG. 6 shows a substrate support and a plurality of power supplies of a plasma processing apparatus according to further still another exemplary embodiment. A substrate support 11D shown in FIG. 6 may be employed as the substrate support 11 of the plasma processing apparatus 1. The substrate support 11D has a base 16D instead of the base 16. The base 16D includes a first portion 161D and a second portion 162D.

Each of the first portion 161D and the second portion 162D are made of a conductive material. Each of the first portion 161D and the second portion 162D is made of a metal such as aluminum or a metal-ceramic composite.

The first portion 161D is disposed below the first region 181. The first portion 161D includes the center of the base 16D and has a substantially disc shape. The second portion 162D is disposed below the second region 182. The second portion 162D extends in the circumferential direction at a radially outer side of the first portion 161D. The second portion 162D may have a substantially annular shape in plan view. The second portion 162D is separated from the first portion 161D. The gap between the first portion 161D and the second portion 162D may be filled with an insulator material (the insulator part 11i) or a dielectric material.

In one embodiment, the second portion 162D may include portions 162e and 162f. The portions 162e and 162f constitute a bipolar electrode. Each of portions 162e and 162f extends in the circumferential direction at the radially outer side of the first portion 161D. Each of the portions 162e and 162f may have a substantially annular shape in plan view. The portion 162f may extend in the circumferential direction at the radially outer side of the portion 162e. The portions 162e and 162f are separated from each other. The gap between the portions 162e and 162f may be filled with an insulator material or a dielectric material.

The chuck power supply 31 is connected to the first portion 161D via the switch 31s. When a DC voltage from the chuck power supply 31 is applied to the first portion 161D, the substrate W is attracted to the first region 181 by an electrostatic attractive force and held on the substrate support 11D.

The chuck power supply 32 is connected to the portion 162e via the switch 32s. The chuck power supply 33 is connected to the portion 162f via the switch 33s. When a DC voltage from the chuck power supply 32 is applied to the portion 162e and a DC voltage from the chuck power supply 33 is applied to the portion 162f, the edge ring ER is attracted to the second region 182 by an electrostatic attractive force and held on the substrate support 11D.

The radio frequency power supply 51 is connected to the first portion 161D via the matching device 51m. The radio frequency power supply 52 is connected to the portion 162e via the matching device 52m and the capacitor 54ca. Further, the radio frequency power supply 52 is connected to the portion 162f via the matching device 52m and the capacitor 54cb.

The bias power supply 53 is connected to the first portion 161D via the matching device 53m and the capacitor 53c. The bias power supply 54 is connected to the portion 162e via the matching device 54m and the capacitor 54ca. The bias power supply 54 is connected to the portion 162f via the matching device 54m and the capacitor 54cb.

In the substrate support 11D, no electrode is disposed in the dielectric part 18, so that the thickness of the dielectric part 18 can be reduced. Therefore, the impedance between the first portion 161D of the base 16D and the substrate W and the impedance between the second portion 162D of the base 16D and the edge ring ER are reduced. Accordingly, the bias energy is efficiently supplied to the substrate W and the edge ring ER.

In one embodiment, the dielectric part 18 may satisfy the following Eq. (2).

$$0.5 \times C_{WO}/S_W < C_{FO}/S_F < 1.5 \times C_{WO}/S_W \qquad \text{Eq. (2)}$$

In Eq. (2), $C_{WO}$ indicates the capacitance between the base 16D and the substrate W. $S_W$ indicates the area of one main surface (for example, the bottom surface or the surface in contact with plasma) of the substrate W. $C_{FO}$ indicates the capacitance between the base 16D and the edge ring ER. $S_F$ indicates the area of one main surface (for example, the bottom surface or the surface in contact with plasma) of the edge ring ER. By satisfying Eq. (2), the difference between the power density of the radio frequency power coupled to the plasma via the substrate W and the power density of the radio frequency power coupled to the plasma via the edge ring ER is reduced. Therefore, the variation in the plasma density in the chamber is suppressed.

In one embodiment, the substrate support 11D may be configured such that the capacitance between the substrate W and the edge ring ER becomes 10 nF or less or 3 nF or less. Accordingly, the electrical coupling between the substrate W and the edge ring ER is suppressed.

Figure 7:
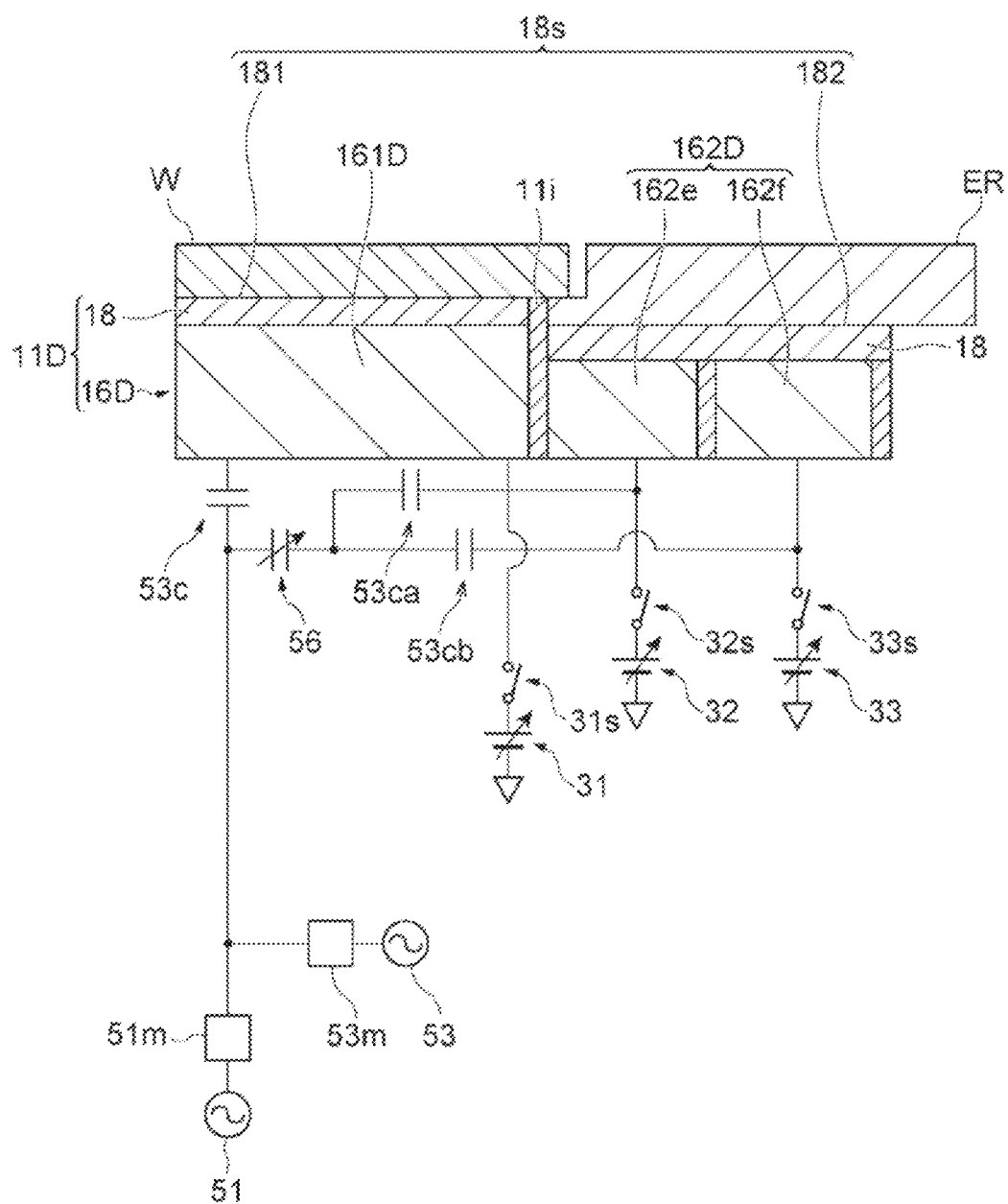
FIG. 7 shows a substrate support and a plurality of power supplies of a plasma processing apparatus according to further still another exemplary embodiment.

Hereinafter, FIG. 7 will be referred to. FIG. 7 shows a substrate support and a plurality of power supplies of a plasma processing apparatus according to further still another exemplary embodiment. As shown in FIG. 7, the plasma processing apparatus 1 may not include the radio frequency power supply 52, the matching device 52m, the bias power supply 54, and the matching device 54m.

As shown in FIG. 7, the radio frequency power supply 51 is connected to the portion 162e via the matching device 51m, the impedance circuit 56, and the capacitor 53ca. Further, the radio frequency power supply 51 is connected to the portion 162f via the matching device 51m, the impedance circuit 56, and the capacitor 53cb. The bias power supply 53 is connected to the portion 162e via the matching device 53m, impedance circuit 56, and the capacitor 53ca. Further, the bias power supply 53 is connected to the portion 162f via the matching device 53m, the impedance circuit 56, and the capacitor 53cb.

In the example plasma processing apparatus 1 shown in FIG. 7, the radio frequency power from the single radio frequency power supply 51 is distributed to the first portion 161D and the second portion 162D. Further, in the example plasma processing apparatus 1 shown in FIG. 7, the bias energy from the single bias power supply 53 is distributed to the first portion 161D and the second portion 162D. A distribution ratio of each of the radio frequency power and the bias energy is set by adjusting the variable impedance of the impedance circuit 56. The other configurations in the example shown in FIG. 7 are the same as those in the example shown in FIG. 6.

Figure 8:
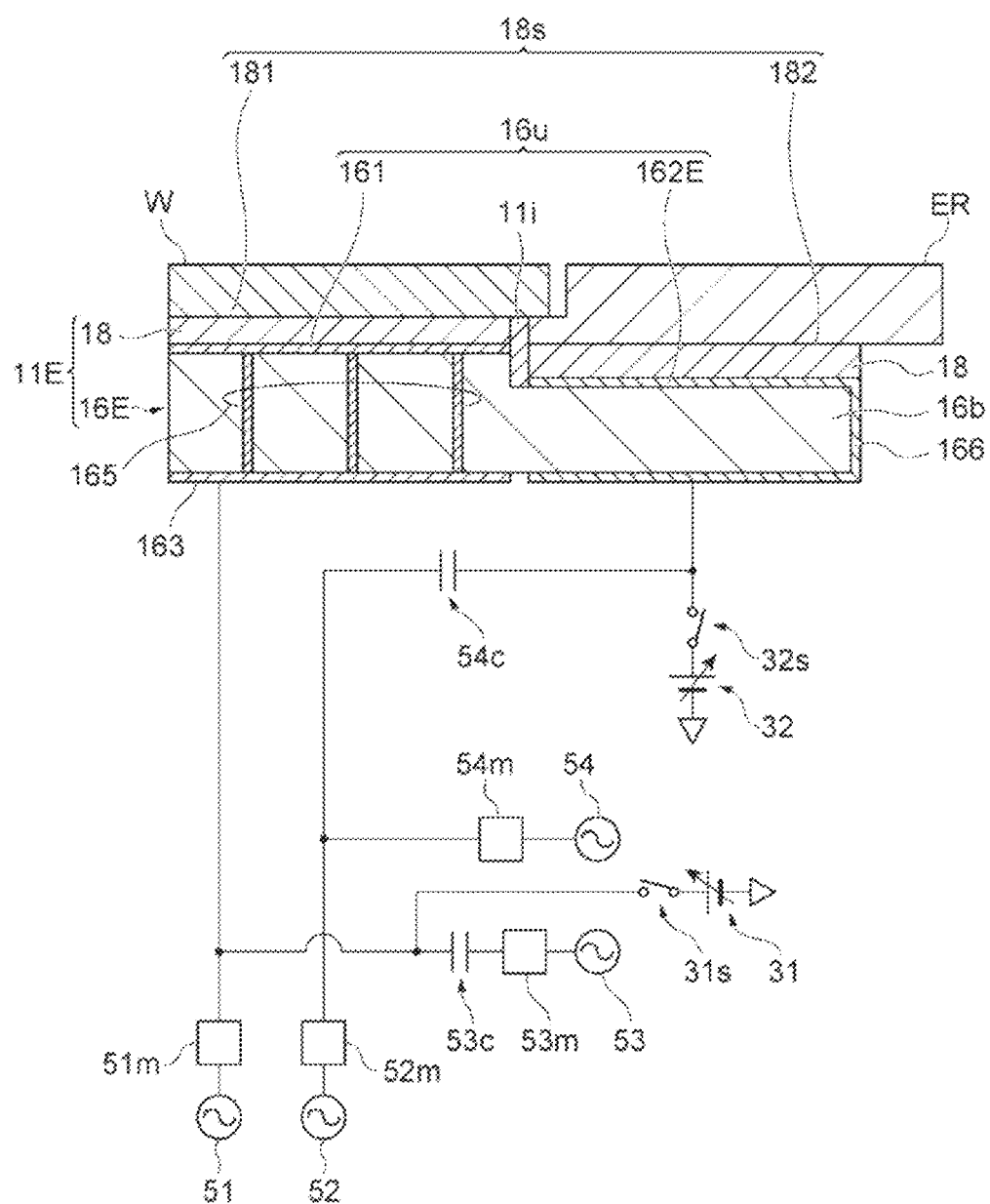
FIG. 8 shows a substrate support and a plurality of power supplies of a plasma processing apparatus according to further still another exemplary embodiment.

Hereinafter, FIG. 8 will be referred to. FIG. 8 shows a substrate support and a plurality of power supplies of a plasma processing apparatus according to further still another exemplary embodiment. In the substrate support 11A and the substrate support 11B described above, the second electrode 162 includes two electrodes. On the other hand, in the substrate support 11E shown in FIG. 8, the second electrode 162E is configured as a single electrode. The wiring 166 extending from the bottom surface of the base member 16b while passing through the end surface is connected to the second electrode 162E. Each of one or more wirings 165 may connect the electrode 163 and the first electrode 161 via a groove formed at the peripheral portion of the base member 16b.

The chuck power supply 32 is connected to the second electrode 162E via the switch 32s and the wiring 166. Further, the radio frequency power supply 52 is connected to the second electrode 162E via the matching device 52m, a capacitor 54c, and the wiring 166. Further, the bias power supply 54 is connected to the second electrode 162E via the matching device 54m, the capacitor 54c, and the wiring 166.

The radio frequency power from the radio frequency power supply 51 may be distributed to the first electrode 161 and the second electrode 162E. Further, the bias energy from the bias power supply 53 may be distributed to the first electrode 161 and the second electrode 162E.

Figure 9:
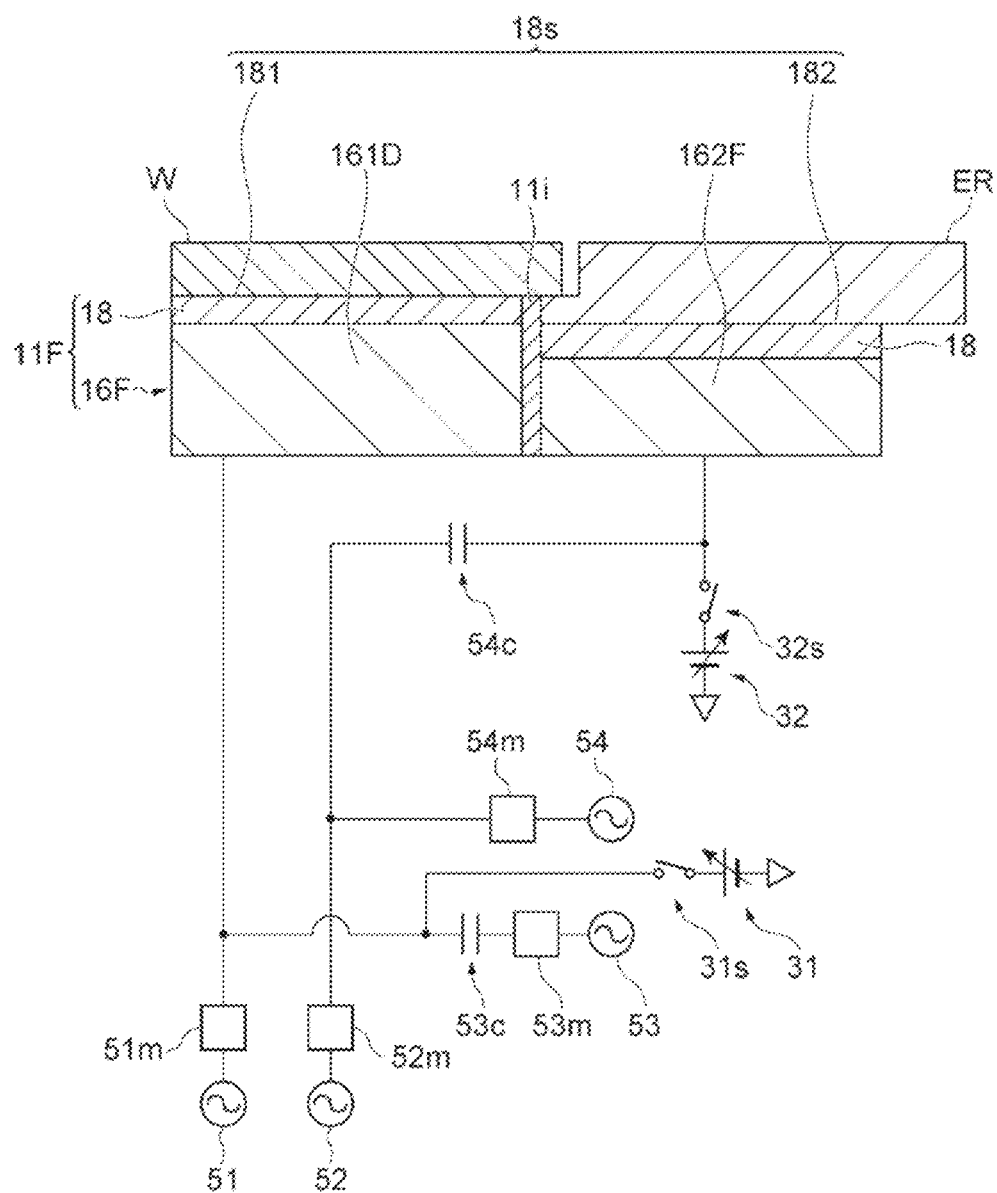
FIG. 9 shows a substrate support and a plurality of power supplies of a plasma processing apparatus according to further still another exemplary embodiment.

Hereafter, FIG. 9 will be referred to. FIG. 9 shows a substrate support and a plurality of power supplies of a plasma processing apparatus according to further still another exemplary embodiment. In the substrate support 11D described above, the second portion 162D includes the two portions 162e and 162f. On the other hand, in the base 16F of the substrate support 11F shown in FIG. 9, a second portion 162F is formed as a single portion.

The chuck power supply 32 is connected to the second portion 162F via the switch 32s. Further, the radio frequency power supply 52 is connected to the second portion 162F via the matching device 52m and the capacitor 54c. Further, the bias power supply 54 is connected to the second portion 162F via the matching device 54m and the capacitor 54c. The radio frequency power from the radio frequency power supply 51 may be distributed to the first portion 161D and the second portion 162F. Further, the bias energy from the bias power supply 53 may be distributed to the first portion 161D and the second portion 162F.

Figure 10:
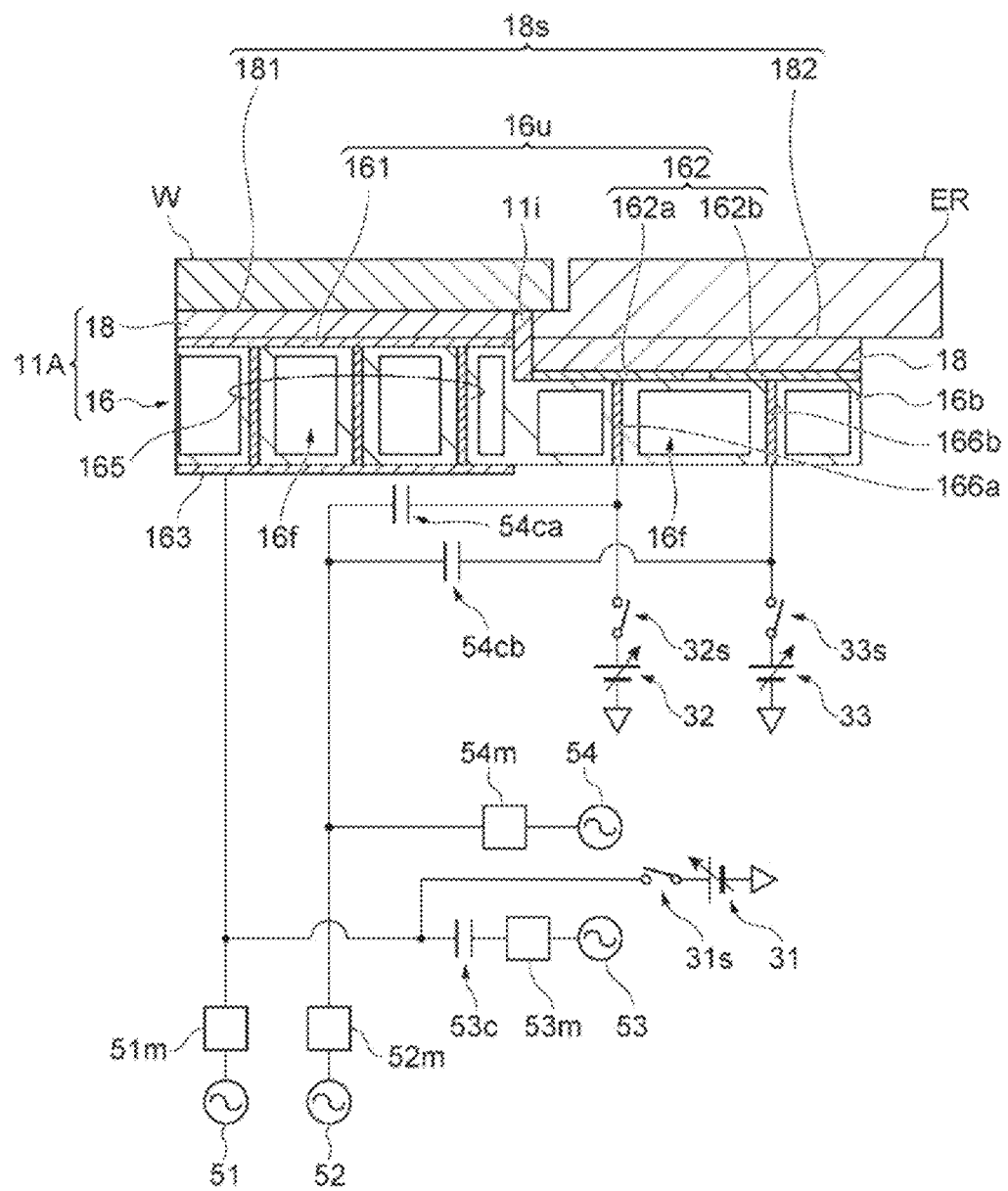
FIG. 10 shows a substrate support and a plurality of power supplies of a plasma processing apparatus according to further still another exemplary embodiment.

Hereinafter, FIG. 10 will be referred to. FIG. 10 shows a substrate support and a plurality of power supplies of a plasma processing apparatus according to further still another exemplary embodiment. The example shown in FIG. 10 is a modification of the example shown in FIG. 3. In the example shown in FIG. 10, a channel 16f is formed in the base 16. A heat medium (for example, a coolant) is supplied from a supply device to the channel 16f. The heat medium flows through the channel 16f and returns to the supply device. The channel 16f may be formed to have a wide cross-sectional area without decreasing the mechanical strength of the base 16. The channel 16f may be formed in the base 16 in the above-described examples other than the example shown in FIG. 3.

Figure 11:
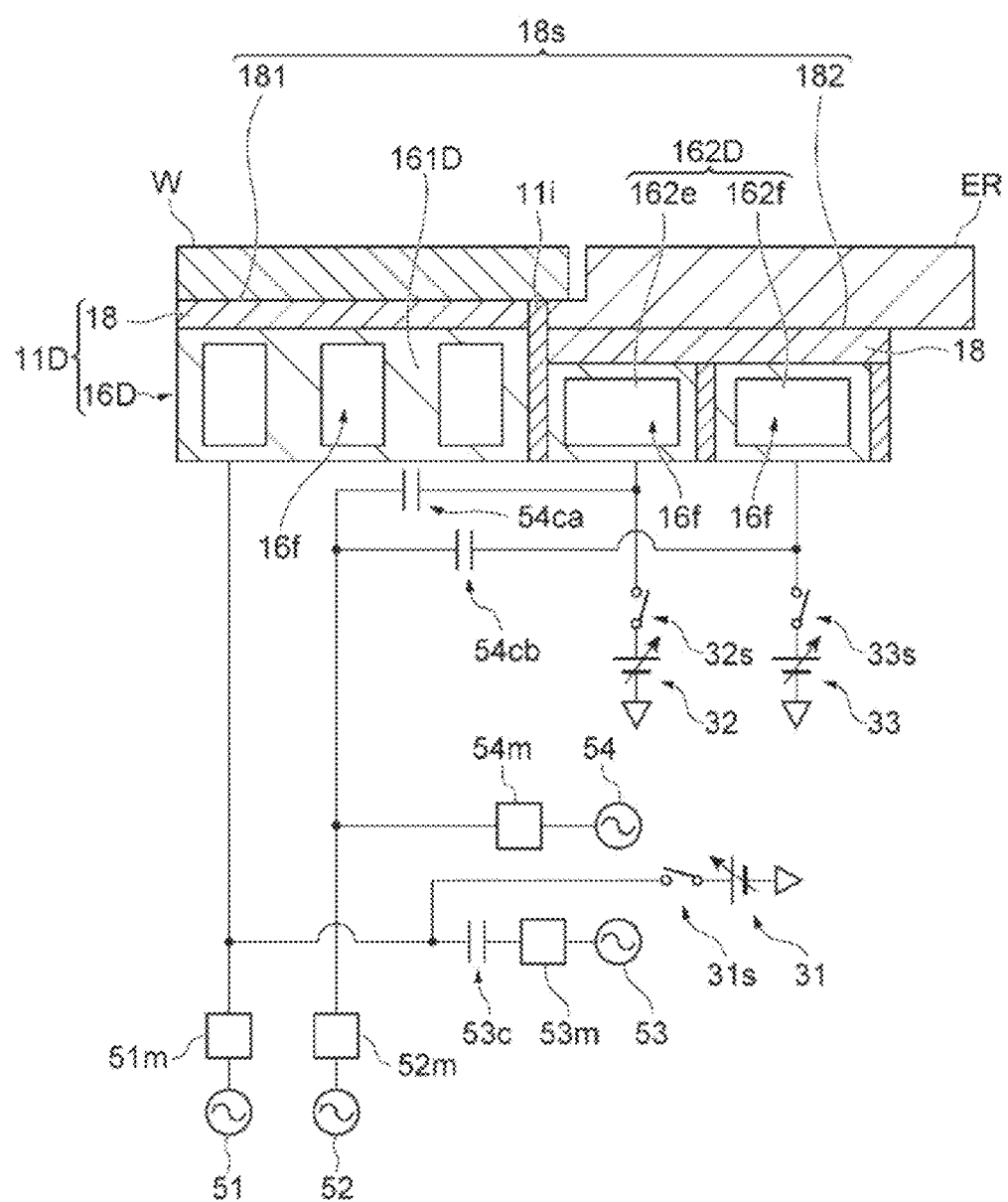
FIG. 11 shows a substrate support and a plurality of power supplies of a plasma processing apparatus according to further still another exemplary embodiment.

Hereafter, FIG. 11 will be referred to. FIG. 11 shows a substrate support and a plurality of power supplies of a plasma processing apparatus according to further still another exemplary embodiment. The example shown in FIG. 11 is a modification of the example shown in FIG. 6. In the example shown in FIG. 11, the channel 16f is formed in the base 16D. A heat medium (for example, a coolant) is supplied from a supply device to the channel 16f. The heat medium flows through the channel 16f and returns to the supply device. The channel 16f may be formed to have a wide cross-sectional area without decreasing the mechanical strength of the base 16D. The channel 16f may be formed in the base 16D in the above-mentioned examples other than the example shown in FIG. 6. The channel 16f may be formed in the base 16F in the example shown in FIG. 9.

Figure 12:
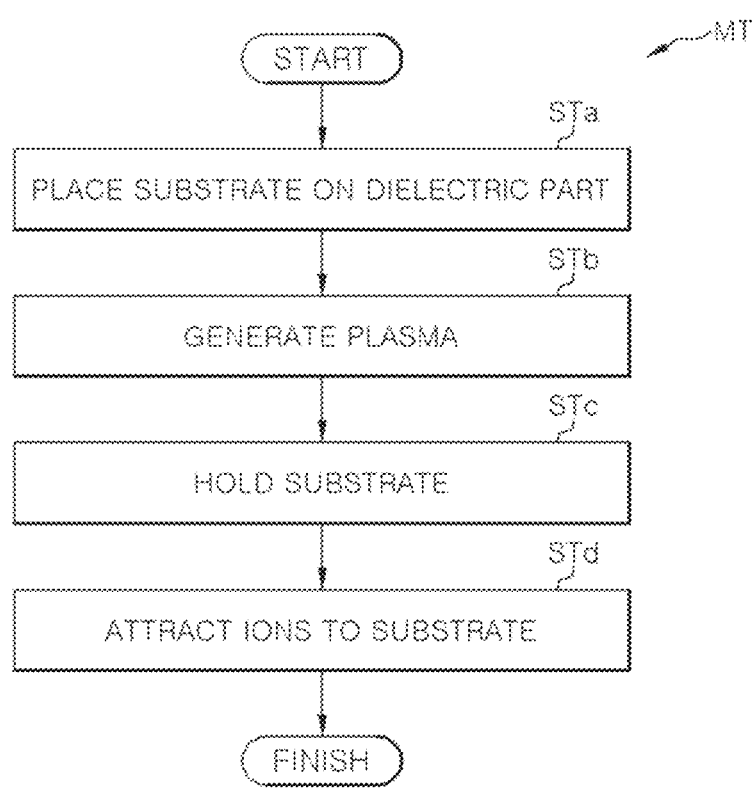
FIG. 12 is a flowchart of a substrate processing method according to one exemplary embodiment.

Hereinafter, FIG. 12 will be referred to. FIG. 12 is a flowchart of a substrate processing method according to one exemplary embodiment. The substrate processing method shown in FIG. 12 (hereinafter, referred to as "method MT") can be performed using the plasma processing apparatus 1 described above. In the method MT, the individual components of the plasma processing apparatus 1 can be controlled by the controller 2. The method MT includes steps STa, STb, STc, and STd.

In step STa, the substrate W is placed on the dielectric part 18 of the substrate support. Steps STb, STc, and STd are performed in a state where the substrate W is placed on the dielectric part 18.

In step STb, plasma is generated in the chamber 10 using the plasma generator. In step STb, the processing gas is supplied from the gas supply part 20 into the plasma processing chamber 10. Further, in step STb, the exhaust system 40 reduces a pressure in the plasma processing chamber 10 to a specified pressure. Further, in step STb, the radio frequency power is supplied to generate plasma from the processing gas.

In step STc, the substrate W is held by the substrate support by applying a voltage from the chuck power supply 31. The edge ring ER may be held by the substrate support in step STc by applying a voltage from the chuck power supply 32 and the chuck power supply 33. Alternatively, the edge ring ER may be held by the substrate support before step STb.

Step STd is performed when the plasma is generated in step STb. In step STd, the bias energy is supplied to attract ions from the plasma to the substrate W.

While various exemplary embodiments have been described above, the present disclosure is not limited to the above-described embodiments, and various additions, omissions, substitutions and changes may be made. Further, other embodiments can be implemented by combining elements in different embodiments.

For example, the radio frequency power from the radio frequency power supply may be supplied to the upper electrode instead of the substrate support. Further, in another embodiment, the plasma processing apparatus may be a plasma processing apparatus other than a capacitively coupled plasma processing apparatus. Such a plasma processing apparatus may be an inductively coupled plasma processing apparatus, an electron cyclotron resonance (ECR) plasma processing apparatus, or a plasma processing apparatus for generating plasma using surface waves such as microwaves.

From the above description, it will be appreciated that various embodiments of the present disclosure have been described herein for purposes of illustration, and that various changes may be made without departing from the scope and spirit of the present disclosure. Therefore, the various embodiments disclosed herein are not intended to be limiting, with a true scope and spirit being indicated by the following claims.

The invention claimed is:

1. A plasma processing apparatus comprising:
   a chamber;
   a substrate support disposed in the chamber;
   a plasma generator configured to generate plasma in the chamber;
   a bias power supply configured to generate bias energy for attracting ions from the plasma to a substrate; and
   a chuck power supply configured to generate a voltage applied to the substrate support to hold the substrate using an electrostatic attractive force,
   wherein the bias energy is a radio frequency power or a periodically generated voltage pulse,
   the substrate support includes:
   a base including a base member made of a dielectric or an insulator and an electrode formed on an upper surface of the base member, the electrode forming an upper surface of the base; and
   a dielectric part that provides a supporting surface on which the substrate is placed, extends from the upper surface of the base to the supporting surface, and is made of only a dielectric, and
   the bias power supply and the chuck power supply are electrically connected to the electrode of the base.

2. The plasma processing apparatus of claim 1, wherein the bias power supply is electrically connected to the electrode via a capacitor, and is separated from the chuck power supply in a DC manner.

3. The plasma processing apparatus of claim 1, wherein the bias power supply and the chuck power supply are electrically connected to the electrode via a wiring extending between the upper surface and a bottom surface of the base member.

4. The plasma processing apparatus of claim 1, wherein the plasma generator includes a radio frequency power supply electrically connected to the electrode of the base.

5. The plasma processing apparatus of claim 1, wherein the supporting surface includes a first region on which the substrate is placed and a second region on which an edge ring is placed,
the electrode is a first electrode disposed below the first region,
the base further includes a second electrode,
the second electrode is disposed below the second region, forms the upper surface of the base, and is separated from the first electrode, and
the bias power supply or another bias power supply and another chuck power supply are electrically connected to the second electrode.

6. The plasma processing apparatus of claim 5, wherein the second electrode includes two electrodes constituting a bipolar electrode, and
said another chuck power supply includes two power supplies respectively connected to the two electrodes.

7. The plasma processing apparatus of claim 5, wherein the bias power supply or said another bias power supply is electrically connected to the second electrode via a capacitor and is separated from said another chuck power supply in a DC manner.

8. The plasma processing apparatus of claim 5, wherein the bias power supply or said another bias power supply and said another chuck power supply are electrically connected to the second electrode via a wiring extending between the upper surface and a bottom surface of the base member.

9. A plasma processing apparatus comprising:
a chamber;
a substrate support disposed in the chamber;
a plasma generator configured to generate plasma in the chamber;
a bias power supply configured to generate bias energy for attracting ions from the plasma to a substrate; and
a chuck power supply configured to generate a voltage applied to the substrate support to hold the substrate using an electrostatic attractive force,
wherein the bias energy is a radio frequency power or a periodically generated voltage pulse,
the substrate support includes:
a base; and
a dielectric part that provides a supporting surface on which a substrate is placed, extends from an upper surface of the base to the supporting surface, and is made of only a dielectric,
the supporting surface includes a first region on which the substrate is placed and a second region on which an edge ring is placed,
the base includes:
a first portion made of a conductive material and disposed below the first region; and
a second portion that is made of a conductive material, disposed below the second region, and separated from the first portion,
the bias power supply and the chuck power supply are electrically connected to the first portion, and
the bias power supply or another bias power supply and another chuck power supply are electrically connected to the second portion.

10. The plasma processing apparatus of claim 9, wherein the second portion includes two portions constituting a bipolar electrode, and
said another chuck power supply includes two power supplies respectively connected to the two portions.

11. The plasma processing apparatus of claim 9, wherein the bias power supply is electrically connected to the first portion via a capacitor and is separated from the chuck power supply in a DC manner, and
the bias power supply or said another bias power supply is electrically connected to the second portion via a capacitor and is separated from the separate chuck power supply in a DC manner.

12. The plasma processing apparatus of claim 9, wherein the plasma generator includes a radio frequency power supply electrically connected to the first portion of the base.

13. A substrate processing method using the plasma processing apparatus according to claim 1, comprising:
placing a substrate on the dielectric part of the substrate support;
generating plasma in the chamber using the plasma generator;
holding the substrate on the substrate support by supplying a voltage from the chuck power supply; and
attracting ions from the plasma to the substrate by supplying the bias energy from the bias power supply.

* * * * *